Nov. 30, 1965 HIROE OSAFUNE ET AL 3,221,215

DEVICE COMPRISING A PLURALITY OF ELECTRICAL COMPONENTS

Filed Jan. 22, 1963 2 Sheets-Sheet 1

INVENTORS
HIROE OSAFUNE
TOSHIO KUROSAWA
ICHIEMON SASAKI

BY Hopgood & Calimafde
ATTORNEYS

DEVICE COMPRISING A PLURALITY OF ELECTRICAL COMPONENTS

Filed Jan. 22, 1963 2 Sheets-Sheet 2

INVENTORS
HIROE OSAFUNE
TOSHIO KUROSAWA
ICHIEMON SASAKI

BY Haseltine & Calinafde

ATTORNEYS

United States Patent Office 3,221,215

Patented Nov. 30, 1965

3,221,215
DEVICE COMPRISING A PLURALITY OF ELECTRICAL COMPONENTS

Hiroe Osafune, Toshio Kurosawa, and Ichiemon Sasaki, Tokyo, Japan, assignors to Nippon Electric Company Limited, Tokyo, Japan, a corporation of Japan Filed Jan. 22, 1963, Ser. No. 253,222
Claims priority, application Japan, Jan. 30, 1962, 37/3,452
2 Claims. (Cl. 317—101)

This invention relates to a miniature device having a plurality of electrical components formed as an integral part thereof, and more particularly to such a device wherein such components may be so arranged and connected as to form a desired circuit integral with said device.

The inductance-capacitance filter, which is widely employed in communication systems, has at the present state of the art, reached a limit of micro-miniaturization, using ordinary techniques. Such techniques, however, still employ relatively large inductors in combination with very small film condensers manufactured by the vacuum evaporation process, and consequently substantial improvement in micro-miniaturization and reliability of such inductance-capacitance combinations is yet to be realized.

Accordingly, it is an object of this invention to provide an integrated electrical device comprising a plurality of electrical components to thereby substantially improve micro-miniaturization and reliability of frequency selective devices.

It is a further object of this invention to produce an integrated electrical device wherein transistor elements and various circuit component elements associated therewith are all formed together as an integral part of said device during its manufacture.

All of the objects, features and advantages of this invention and the manner of attaining them will become more apparent and the invention itself will be best understood by reference to the following description of an embodiment of the invention taken in conjunction with the accompanying drawing, in which:

FIGS. 1*a* and 1*b* are plan and sectional views respectively, of a typical example of a semiconductor body containing elements and junctions in accordance with the teachings of this invention;

In the various drawings, like numerals denote the same or equivalent parts.

Briefly, in accordance with one aspect of the invention, resistance-capacitance filter elements having electrical characteristics substantially equivalent to inductance-capacitance filter elements are formed while associated circuit electron flow elements are also formed during manufacture within a single block or body of suitable material such as a semiconductor. That is, the resistance-capacitance combination is a part of the semiconductor body which also forms the transistors with which the resistance-capactitance combination is associated, the various elements being formed by means of a plurality of PN junctions having diffused layer resistance insensitive to temperature, and high capacitance per unit length. Various connections are made between the elements thus formed to thereby produce an entirely integrated device comprising a circuit formed of resistance, capacitance and transistors.

Referring now to FIG. 1, the numeral 1 denotes a block or body of semiconductor material such as, for example, N type silicon. Circular P type elements or domains 2, 4 and 6 are formed in the body 1 by diffusion of impurities or other suitable means, and then circular N type domains 3, 5 and 7 are also formed, thereby producing a plurality of PN junctions. The resistance in the transverse direction within each domain is variable over a considerable range depending on the factors in the diffusion process. If desired, the transverse resistance can be made zero, by coating a suitable metal such as for example aluminum, on selected surface portions by means of an evaporation process, after the above diffusion process has been completed.

Figure 1A:
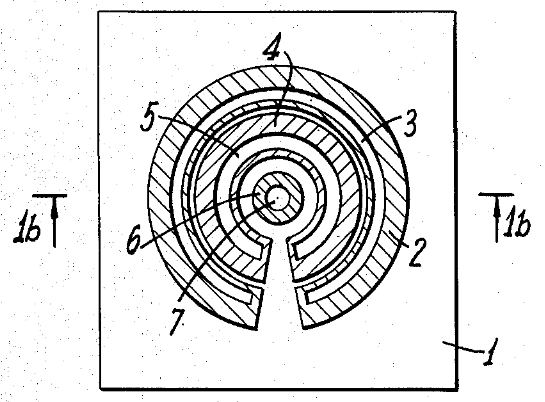
Figure 1B:
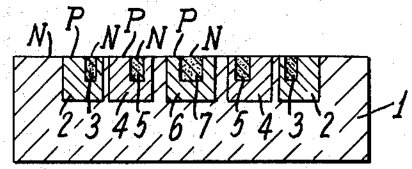
Figure 2:
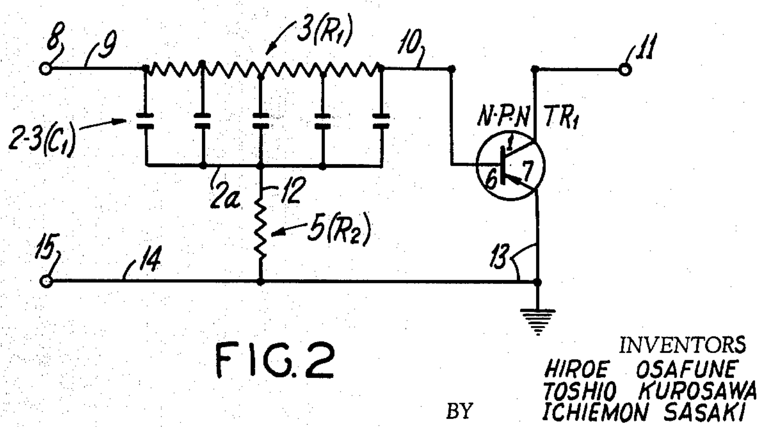
FIG. 2 shows a circuit with a band elimination filter and an amplifier transistor coupled thereto.
Figure 3:
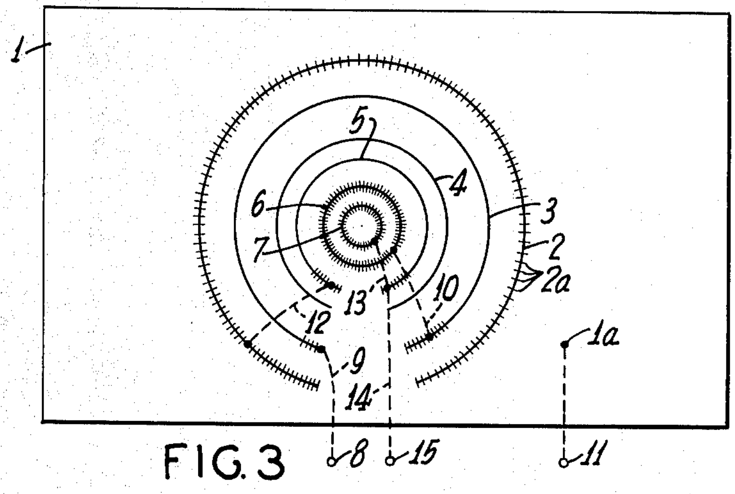
FIG. 3 shows a practical embodiment of the circuit of FIG. 2, utilizing the semiconductor block or body of FIG. 1.

FIG. 2 illustrates a circuit comprising a band-elimination filter and an amplifier element coupled together, which may be manufactured in accordance with this invention, while FIG. 3 shows an actual device incorporating this circuit and employing the construction shown in FIGS. 1*a* and 1*b*. In FIG. 3 the domains of FIG. 1 are indicated or shown by the circular lines. In addition, within each domain, the parts requiring metal to achieve the transverse resistance of zero or to bring connecting leads out are shown as short lines crossing the circular lines; in these areas the surface of the one domain or terminal is coated with metal which does not encroach upon the other domains.

In FIG. 3, the electrode or terminal 8 is connected to one end of the N domain 3 by the lead wire 9. Since metal is not coated on this N-domain except in the region of contact with the wire 9, the transverse resistance $R_1$ is formed, see FIG. 2. The opposite end of the N-domain 3 is connected by the wire 10 to the base of the NPN transistor $TR_1$, this base being formed by the P-domain 6. On the base and emitter of the transistor $TR_1$, i.e. the domains 6 and 7 respectively, metal is coated by an evaporation process in order to improve the characteristics of the transistor. The emitter 7 is connected to the electrode or terminal 15 by the lead wires 13 and 14. The capacitance $C_1$, represented by the five capacitors shown in FIG. 2, is formed by the PN junction 2–3 between the P-type domain 2 and the N-type domain 3.

As a metal coating **2*a* has been deposited on the P-type domain 2 in FIG. 3, any point along this domain 2 is connected to one end of the N-type domain 5 by the lead wire 12. The other end of the domain 5 is connected to the terminal 15 by the lead wire 14. The domain 5 forms the resistance $R_2$. Thus is constructed the entire circuit of FIG. 2 as an integrated unit in the form of a single block or body. With regard to the semiconductor block 1, it is to be observed that there exist domains and PN junctions which are not utilized in FIGS. 2 and 3, such as the N-domain 4, and junction 1–2**, for example. These can be additionally utilized to produce various different circuits by connecting the wires different from that described above, but utilizing the same basic junction and domain arrangement of FIG. 1.

Although in the explanation of FIGS. 2 and 3 wire is used in connecting each domain, connections can also be accomplished by one coating of metal by suitable evaporation and masking technique. Also, although description is made herein in such a manner that the electrodes 8, 11 and 15 are outside the block or body, they can also be formed by attaching insulators on the surfaces of various parts of the body and then coating metal thereon by an evaporation process to form the terminals 8, 15 and 11, and the lead wires 9 and 14 simultaneously. In such cases, the terminal contact 1a would serve as the terminal 11 for the block or body 1 so that a wire from the terminal 11 to the body would not be necessary.

Figure 4:
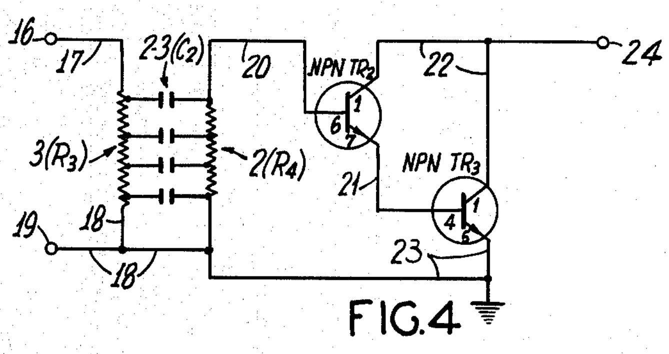
FIG. 4 is a circuit comprising a high-pass filter and a two stage amplifier coupled thereto.
Figure 5:
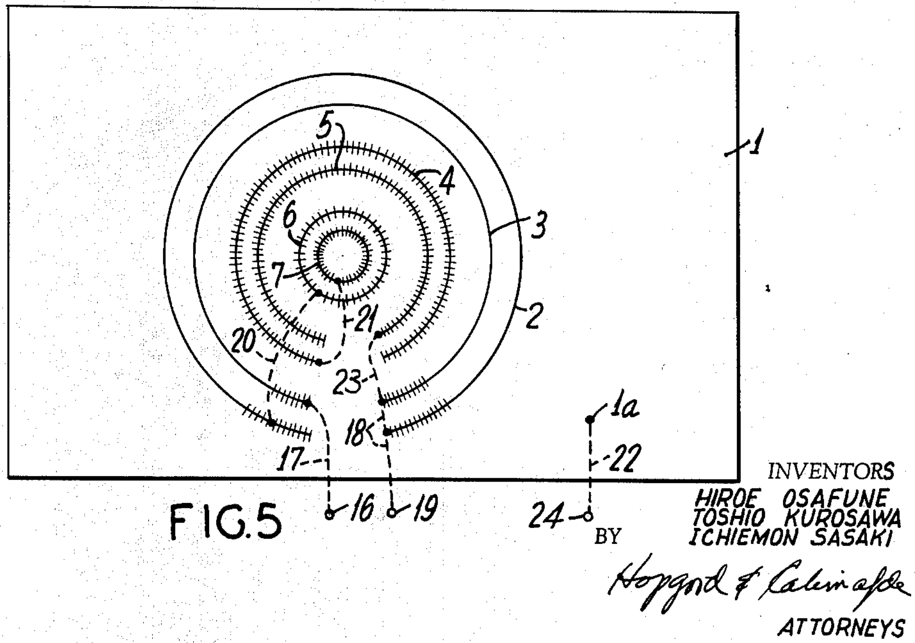
FIG. 5 shows a practical embodiment of the circuit of FIG. 4, utilizing the basic block or body shown in FIG. 1.

FIGS. 4 and 5 together illustrate the basic block shown in FIG. 1 employed to produce a circuit coupling a high-pass filter to a Darlington type amplifier circuit. In this arrangement, the N-domain 3 is used for the resistance $R_3$, the P-domain 2 for the resistance $R_4$, and the PN junction capacity between the domains 2 and 3 for the capacity $C_2$. In addition, the domains 6 and 7 are used respectively, as the base and emitter of the NPN transistor $TR_2$, the domains 4 and 5 are used as the base and the emitter respectively, of the transistor $TR_3$, and the body or block, i.e. the N-domain 1, is used as the common collector for both of these transistors. As in FIGS. 2 and 3 above, the body 1, domain 2–7 and terminals 16, 19 and 24 of FIGS. 4 and 5, are interconnected with various lead wires 17, 18, 20, 21, 22 and 23 to form a complete circuit integral with the body 1.

It should be noted that in the above construction the resistances are formed by the outer domain. This technique is particularly important where the resistances involved are relatively high since for a given semi-conductor block or body size, greater resistance can be obtained in the outer domain. A very important advantage of this construction is that the device can be made extremely small for a given circuit and power capacity, compared with prior art circuits.

Although this invention has been described with specific reference to annular circular or horseshoe shaped regions in the body of the semiconductor, many other shapes can of course also be employed. Also the semiconductor body 1 and the various regions therein need not be limited to the specific type materials and type regions employed in the specific embodiment described. Further, the invention may be carried out utilizing an electron flow device in the form of a semiconductor diode rather than the transistors referred to above.

While the foregoing description sets forth the principles of the invention in connection with specific apparatus, it is to be understood that the description is made only by way of example and not as a limitation of the scope of the invention as set forth in the objects thereof and in the accompanying claims.

What is claimed is:

1. An electrical device having a plurality of electrical circuit components formed integrally therewith comprising a semiconductor body of a given type conductivity, said body having therein a plurality of generally circular shaped domains also of said given type conductivity and a plurality of generally annular shaped domains having a type conductivity opposite to that of said given type, said domains being generally concentric with one another, each of said domains of said opposite type conductivity being in contact with one of said domains of said given type conductivity and also forming a barrier between such given type conductivity domain and the main portion of said body, each of said domains of said opposite type conductivity further forming one junction with said main body portion and another junction with the domain of given type conductivity with which it is associated, a metallic coating formed on the surface of one of said domains, a capacitor, said capacitor being formed by the domain having said metallic coating in combination with the domain with which it is associated and the junction therebetween, and conductive means interconnecting at least one of said domains of said given type conductivity with at least one of said domains of said opposite type conductivity to thereby produce an electrical circuit within said device.

2. An electrical device having a plurality of electrical circuit components formed integrally therewith comprising a semiconductor body of a given type conductivity, said body having therein a plurality of generally circular shaped domains also of said given type conductivity and a plurality of generally annular shaped domains having a type conductivity opposite to that of said given type, said domains being generally concentric with one another, each of said domains of said opposite type conductivity being in contact with one of said domains of said given type conductivity and also forming a barrier between such given type conductivity domain and the main portion of said body, one of said domains of given type conductivity forming a capacitor with the domain of opposite type conductivity with which it is in contact, each of said domains of said opposite type conductivity further forming one junction with said main body portion and another junction with the domain of given type conductivity with which it is associated, a resistor having a relatively high value of electrical resistance, said resistor being produced by providing a domain at the outer periphery of said body in the form of an elongated path having a pair of end terminals, and conductive means interconnecting at least one of said domains of said given type conductivity with at least one of said domains of said opposite type conductivity to thereby produce an electrical circuit within said device.

References Cited by the Examiner

UNITED STATES PATENTS

| | | | |
|---|---|---|---|
| 2,981,877 | 4/1961 | Noyce | 317—101 |
| 3,029,366 | 4/1962 | Lehovec | 317—101 |
| 3,090,873 | 5/1963 | MacKintosh | 317—101 |

OTHER REFERENCES

IBM Bulletin (Schwartz), May 1961, vol. 3, No. 12.

JOHN F. BURNS, *Primary Examiner.*